United States Patent [19]

Fukushima et al.

[11] 4,320,507

[45] Mar. 16, 1982

[54] FIELD PROGRAMMABLE DEVICE HAVING TEST PROVISIONS FOR FAULT DETECTION

[75] Inventors: Toshitaka Fukushima, Yokohama; Kazumi Koyama, Kanagawa; Kouji Ueno, Yokohama, all of Japan

[73] Assignee: Fujitsu Limited, Kawasaki, Japan

[21] Appl. No.: 95,782

[22] Filed: Nov. 19, 1979

[30] Foreign Application Priority Data

Nov. 25, 1978 [JP] Japan .............................. 53-145829

[51] Int. Cl.³ ...................... G06F 11/22; G01R 31/26
[52] U.S. Cl. ...................................................... 371/21
[58] Field of Search ................... 371/21, 51; 365/201; 324/73 R

[56] References Cited

U.S. PATENT DOCUMENTS

| | | | |
|---|---|---|---|
| 3,063,636 | 11/1962 | Sierra | 371/51 X |
| 3,221,310 | 11/1965 | Reach, Jr. | 371/51 X |
| 3,944,800 | 3/1976 | Beck et al. | 365/201 X |
| 3,995,215 | 11/1976 | Chu et al. | 371/21 X |
| 4,176,258 | 11/1979 | Jackson | 324/73 R X |

*Primary Examiner*—David H. Malzahn

[57] ABSTRACT

A field programmable device having a memory cell member including regular bit lines, regular word lines, regular memory cells connected at the cross points of said regular bit lines and regular word lines, test bit or test word lines, and non-conductive and conductive test memory cells connected at the cross points of said regular bit or regular word lines and test word or test bit lines, wherein the conductivity of a test memory cell is determined by the "1" or "0" of the address signal by which the test word or test bit line to which the test memory cell is connected is selected.

7 Claims, 13 Drawing Figures

FIELD PROGRAMMABLE DEVICE HAVING TEST PROVISIONS FOR FAULT DETECTION

BACKGROUND OF THE INVENTION

1. Field of the Invention

The present invention relates to a field programmable device and more particularly a field programmable device having test provisions for detecting faults therein causing defective operations thereof. The field programmable devices to which the present invention relate include any various types of memory cell arrays, for example, a ROM (Read Only Memory), a PROM (Programmable Read Only Memory) and a FPLA (Field Programmable Logic Array).

2. Description of the Prior Art

In general, a field programmable device, such as is illustrated in FIGS. 1 and 2, comprises a memory cell array member 1, an X-direction address inverter 2, a Y-direction address inverter 4, an X-direction decoder driver 3, a multiplexer 5, a programming circuit 7 and an output circuit 6. In the memory cell array member 1, regular memory cells 13 are connected between bit regular lines 11 and regular word lines 12 at cross points of the respectively associated regular bit lines 11 and regular word lines 12. Before forwarding this field programmable device to a user, it is necessary to test it to check for faults in the peripheral circuits, such as the X- and Y-direction address inverters 2, 4, the decoder driver 3, the programming circuit 7, the multiplexer 5 and the output circuit 6. The regular memory cells 13 in the memory cell member 1 are in their original state in which no writing-in of information has been effected, when the field programmable device including the memory array member 1 is supplied from a manufacturer to a user. Therefore, it is necessary to provide test bit lines 14, word lines 15 and test memory cells 16 adjacent to the respective group of plural bit lines 11 and plural word lines 12, for enabling the detection of faults in the peripheral circuits. The test memory cells 16 are selectively placed in a conductive or non-conductive state as a result of selectively applying predetermined data signals.

In the prior art test systems for testing field programmable devices, tests for only a limited number of types of faults in the peripheral circuits are effected, and it is impossible to carry out a wide range of tests covering various types of faults in the peripheral circuits. This prevents reliable testing of the field programmable devices.

SUMMARY OF THE INVENTION

An object of the present invention is to solve the above described problem of the prior art test systems for testing field programmable devices.

The principal object of the present invention is to provide a field programmable device having test lines, such as test bit lines and test word lines, and test memory calls, whereby reliable tests for detecting various types of faults in the peripheral circuits of the field programmable device can be performed.

It is another object of the invention to provide arrangements of the circuit elements of a field programmable device which are suitable for effecting the tests of the field programmable device afforded by the present invention.

DESCRIPTION OF THE PREFERRED EMBODIMENTS

Figure 1:
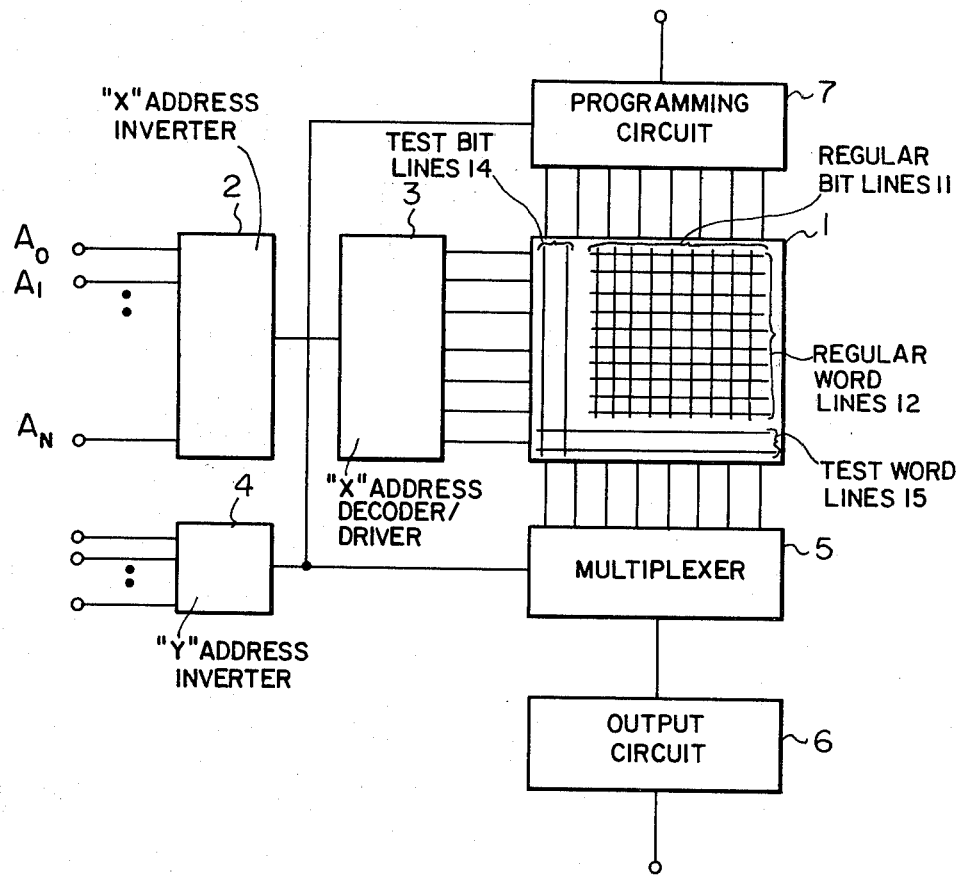
FIG. 1 illustrates a field programmable device of a type to which the present invention may be applied.
Figure 2:
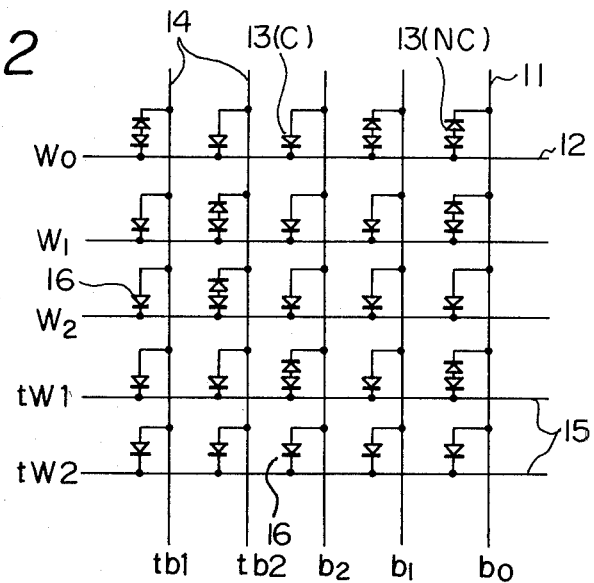
FIG. 2 is a schematic illustration of the arrangement of the memory cells in the memory cell array member of the field programmable device of FIG. 1.

In FIGS. 1 and 2, there is illustrated an example of a field programmable device, which comprises a ROM as a memory cell array member 1, an X-direction address inverter 2, a Y-direction address inverter 4, an X-direction decoder driver 3, a multiplexer 5, a programming circuit 7 and an output circuit 6. In the ROM, or memory cell array member 1, regular memory cells 13 are connected between bit lines 11 and word lines 12 at cross points of the bit lines 11 and the word lines 12. Also in the memory cell array member 1, test bit lines 14 and test word lines 15 are provided adjacent to the respective group or pluralities of the bit lines 11 and the word lines 12; further, test memory cells 16 are connected at cross points of the test bit lines 14 and the test word lines 15 and, respectively, the word lines 12 and the bit lines 11.

Figure 3:
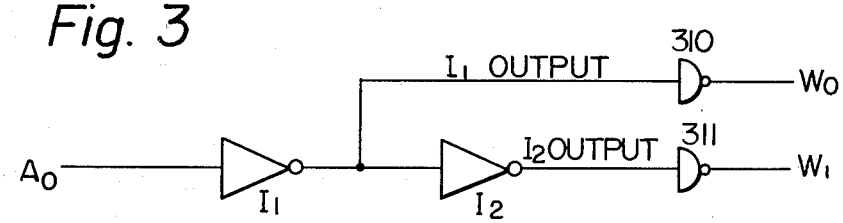
FIG. 3 is a schematic illustration of the a circuit in the address inverter for receiving and responding to a single address signal input of the address signal applied to the field programmable device of FIG. 1.
Figure 5:
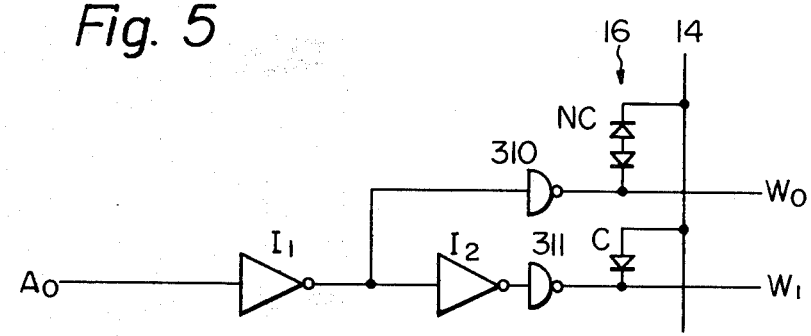
FIG. 5 is a circuit illustrating the connection of test memory cells to a test bit line for a single address signal input in accordance with an embodiment of the present invention.

In accordance with the present invention, the connection of either a conductive test memory cell (C) or a non-conductive test memory cell (NC) is established as illustrated in FIG. 5. In order to understand the connection shown in FIG. 5, it is necessary to analyze the possible defective operations of the inverters of the address inverter 2 of FIG. 1. To facilitate an explanation of this analysis, there is shown in FIG. 3 a circuit comprising inverters $I_1$ and $I_2$ which receives the address input $A_0$ of the addressing signal $A_0, A_1, \ldots A_N$, applied to the address inverter 2 of FIG. 1. An inverter can be in one of three states: a normal state, an abnormal state in which the output signal of the inverter is always "1" (a fixed "1"), and an abnormal state in which the output signal of the inverter is always "0" (a fixed "0"). The possible combinations of the states of the inverter $I_1$ and the inverter $I_2$ are shown in Table 1, below.

TABLE 1

| Case No. | $I_1$ | $I_2$ |
| --- | --- | --- |
| 1 | normal | normal |
| 2 | normal | fixed "1" |
| 3 | normal | fixed "0" |
| 4 | fixed "1" | normal |
| 5 | fixed "1" | fixed "1" |
| 6 | fixed "1" | fixed "0" |
| 7 | fixed "0" | normal |
| 8 | fixed "0" | fixed "1" |
| 9 | fixed "0" | fixed "0" |

With regard to the circuit of FIG. 3, the outputs of the inverters $I_1$ and $I_2$ in accordance with the possible, alternative, signal values, or levels "1" and "0" of the address input $A_0$ are tabulated in Table 2, below, as they correspond to each of the Case Nos. 1 through 9 of Table 1.

TABLE 2

| Case No. | $I_1$ Output | | $I_2$ Output | |
| --- | --- | --- | --- | --- |
|  | $A_0 =$ "1" | $A_0 =$ "0" | $A_0 =$ "1" | $A_0 =$ "0" |
| 1 | "0" | "1" | "1" | "0" |
| 2 | "0" | "1" | "1" | "1" |
| 3 | "0" | "1" | "0" | "0" |
| 4 | "1" | "1" | "0" | "0" |
| 5 | "1" | "1" | "1" | "1" |
| 6 | "1" | "1" | "0" | "0" |
| 7 | "0" | "0" | "1" | "1" |
| 8 | "0" | "0" | "1" | "1" |
| 9 | "0" | "0" | "0" | "0" |

Figure 4:
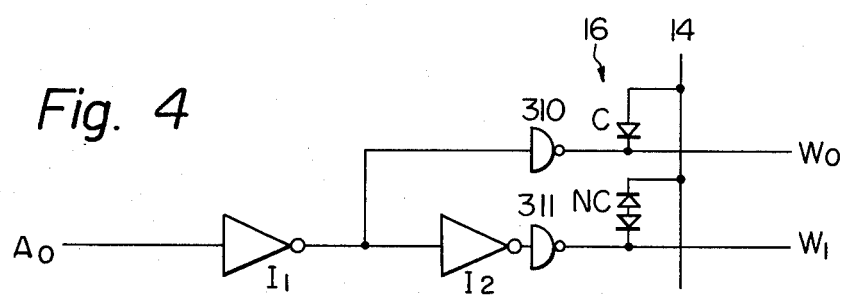
FIG. 4 is a schematic illustrating the connection of test memory cells to a test bit line as in the circuit of FIG. 3.

FIG. 4 illustrates the case where a conductive test memory cell C is connected between a word line $W_0$ and the test bit line 14, and a non-conductive test memory cell NC is connected between a word line $W_1$ and the test bit line 14. The word line $W_0$ is connected through a NAND gate 310 to the output of the inverter $I_1$ and the word line $W_1$ is connected through a NAND gate 311 to the output of the inverter $I_2$. The conduction or the non-conduction of current from the test bit line 14 to either of the word lines $W_0$ and $W_1$ in accordance with signal levels "1" and "0" of the address input $A_0$ are tabulated in Table 3, below, in correspondence to each of the Case Nos. 1 through 9 of Table 2. It should be noted that conduction occurs only through a conductive ("C") test memory cell 16 connected between the test bit line 14 and an associated word line (e.g., $W_0$), and only when the level of that associated word line (e.g., $W_0$) is "0".

TABLE 3

| Case No. | $A_0 =$ "1" | $A_0 =$ "0" |
| --- | --- | --- |
| 1 | Non-conduction | Conduction |
| 2 | Non-conduction | Conduction |
| 3 | Non-conduction | Conduction |
| 4 | Conduction | Conduction |
| 5 | Conduction | Conduction |
| 6 | Conduction | Conduction |
| 7 | Non-conduction | Non-conduction |
| 8 | Non-conduction | Non-conduction |
| 9 | Non-conduction | Non-conduction |

Table 3 indicates that it is impossible to distinguish the Case No. 1, which corresponds to the normal states of both inverters $I_1$ and $I_2$ (Table 1), because the combination of the conditions of non-conduction for $A_0=$"1" and Conduction for $A_0=$"0" occurs identically in the Case No. 2 and the Case No. 3. Accordingly, it is impossible to detect defective operations of the inverters $I_1$ and $I_2$ by means of the connections of the test memory cells 16 illustrated in FIG. 4.

In accordance with the present invention, a non-conductive test memory cell NC is connected between the word line $W_0$ and the test bit line 14 and a conductive test memory cell C is connected between the word line $W_1$ and the test bit line 14, as shown in FIG. 5. The word line $W_0$ is connected through a NAND gate 310 to the output of the inverter $I_1$ and the word line $W_1$ is connected through a NAND gate 311 to the output of the inverter $I_2$. A word line is selected when the level of said word line is caused to be the "0" level in accordance with the corresponding address signal. In this case, the following Table 4 is obtained.

TABLE 4

| Case No. | $A_0 =$ "1" | $A_0 =$ "0" |
| --- | --- | --- |
| 1 | Conduction | Non-conduction |
| 2 | Conduction | Conduction |
| 3 | Non-conduction | Non-conduction |
| 4 | Non-conduction | Non-conduction |
| 5 | Conduction | Conduction |
| 6 | Non-conduction | Non-conduction |
| 7 | Conduction | Conduction |
| 8 | Conduction | Conduction |
| 9 | Non-conduction | Non-conduction |

In Table 4, the combination of the conditions of conduction for $A_0=$"1" and Non conduction for $A_0=$"0" only occurs in the Case No. 1. This indicates that it is possible to distinguish the Case No. 1, which corresponds to the normal states of both inverters $I_1$ and $I_2$, and accordingly, it is possible to detect a fault in that corresponding circuit portion of the address inverter 2 of FIG. 1 with the aid of the test bit line 14.

The above description refers to the case of a single address input. In the case where the number of the address inputs is N, the order of the conductivity of the test memory cells for the additional word lines due to the introduction of additonal address signals, up to the Nth address signal, is the reverse of the order of the conductivity of the test memory cells for the word lines corresponding to the first through the (N−1)th address signals, in accordance with the present invention.

Figure 6:
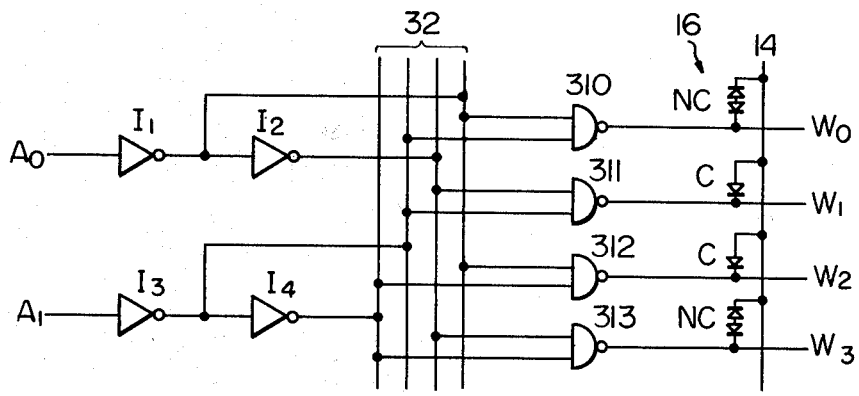
FIG. 6 is a circuit illustrating the connection of test memory cells to a test bit line for two address signal inputs in accordance with the present invention, FIG. 7 diagrammatically the arrangement of test memory cells connected to a test bit line for four address signal inputs in accordance with the present invention.
Figure 7:
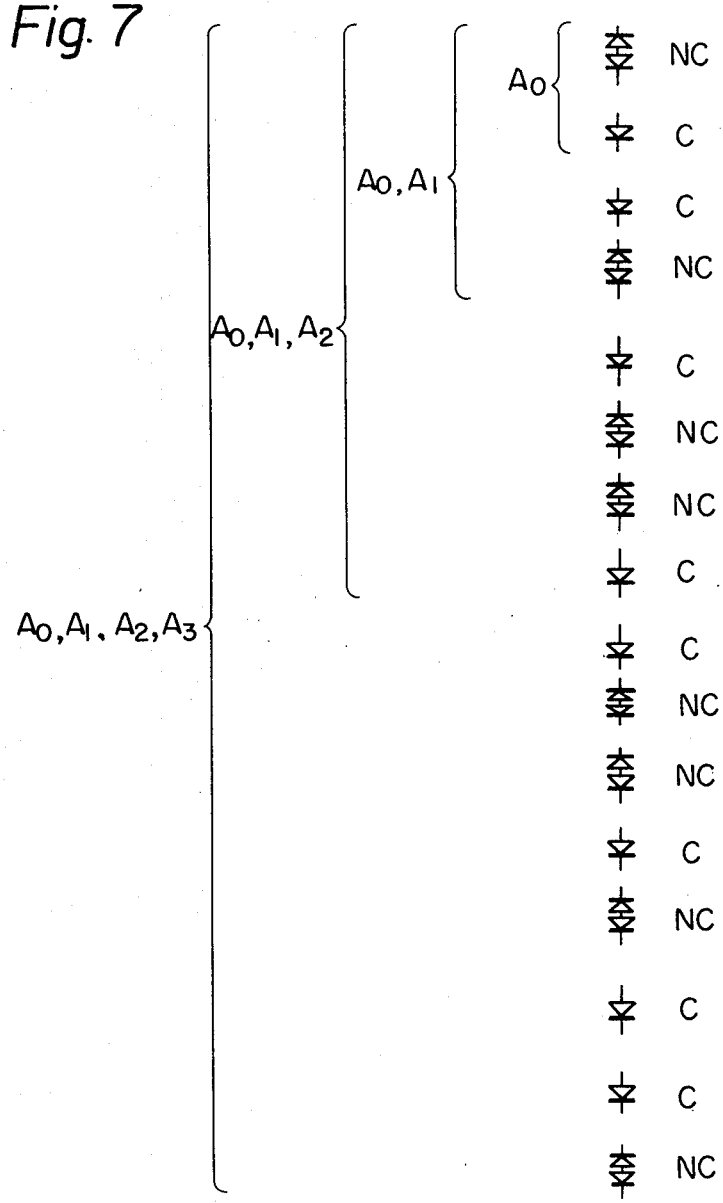

Examples of the case where the number of the address input signals is N are illustrated in FIGS. 6 and 7. The number N of address inputs is two in FIG. 6 and four in FIG. 7. In FIG. 6, the order "C, NC" of the test memory cells 16 connected to the word lines $W_2$ and $W_3$, which are added in accordance with the second address input $A_1$, is the reverse of the order "NC, C" of the test memory cells connected to the word lines $W_0$ and $W_1$. In FIG. 7, the order "C, NC, NC, C" from the fifth test memory cell to the eight test memory cell, which are added in accordance with the third address input signal $A_2$, is the reverse of the order "NC, C, C, NC" from the first test memory cell to the fourth test memory cell, which first through fourth memory test cells correspond to the first and the second address inputs $A_0$ and $A_1$, respectively. Also, the order "C, NC, NC, C, NC, C, C, NC" from the ninth test memory cell to the sixteenth test memory cell, which are added in accordance with the fourth address input $A_3$, is the reverse of the order "NC, C, C, NC, C, NC, NC, C" from the first test memory cell to the eighth test memory cell, which correspond to the first, the second and the third address inputs $A_0$, $A_1$ and $A_2$, respectively.

Figure 8:
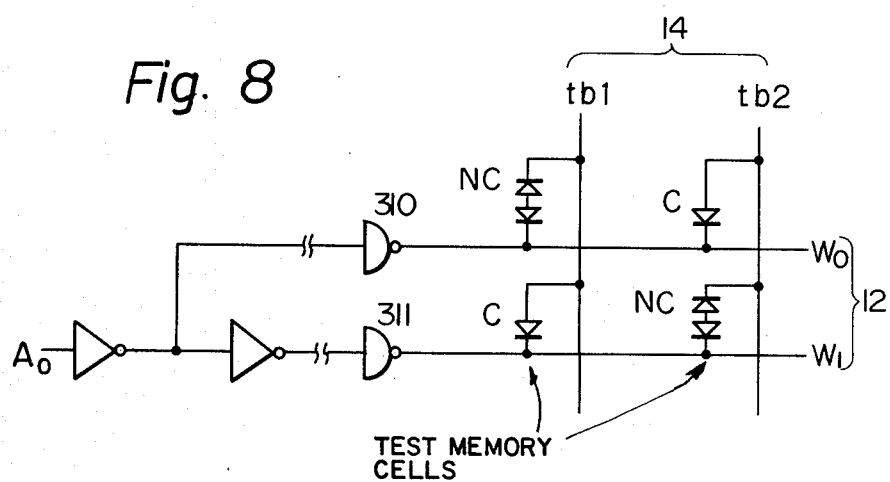
FIG. 8 is a circuit illustrating the arrangement of test memory cells connected to test bit lines for enabling the carrying out of an alternating current characteristic test in accordance with an embodiment of the present invention.

It is preferable that a test of the alternating current characteristic of the field programmable device under test be conducted in addition to a test of the direct current characteristic of the same. The direct current characteristic relates, for example, to the level of the output signals of the logic circuits of the device, while the alternating current characteristic relates, for example, to the rising time or the falling time of the output signals of the logic circuits of the device, and thus its transient, or dynamic, characteristics. A circuit for conducting such an alternating current test in accordance with an embodiment of the present invention is illustrated in FIG. 8 in the test bit line pair 14' comprises. In the circuit of FIG. 8, a first test bit line tb1 and a second test bit line tb2 and the conductivity of a test memory cell 16' connected to the second test bit line tb2 is the reverse of the test memory cell connected to the first test bit line for the same word line 12. For example, the test memory cells 16' comprise a conductive test memory cell C connected between the word line $W_0$ and the test bit line tb2, while a non-conductive test memory cell NC connected between the word line $W_0$ and the test bit line tb1. Thus, at least one conductive C test memory cell 16 is connected to each of the word lines 12. In the circuit of FIG. 8, the test of the alternating current characteristic and the writing-in capabilities for all of the decoder drivers and the address inverters such as are shown in FIG. 1, is performed with the aid of the test bit line pairs 14'. If no second test bit line tb2 were provided, conductive test memory cells C would be connected to only one half of all of the word lines 12. In such a case, testing of only one half of all of the individual decoder driver circuits of, for example, the decoder/driver 3 of FIG. 1, is possible.

Figure 9:
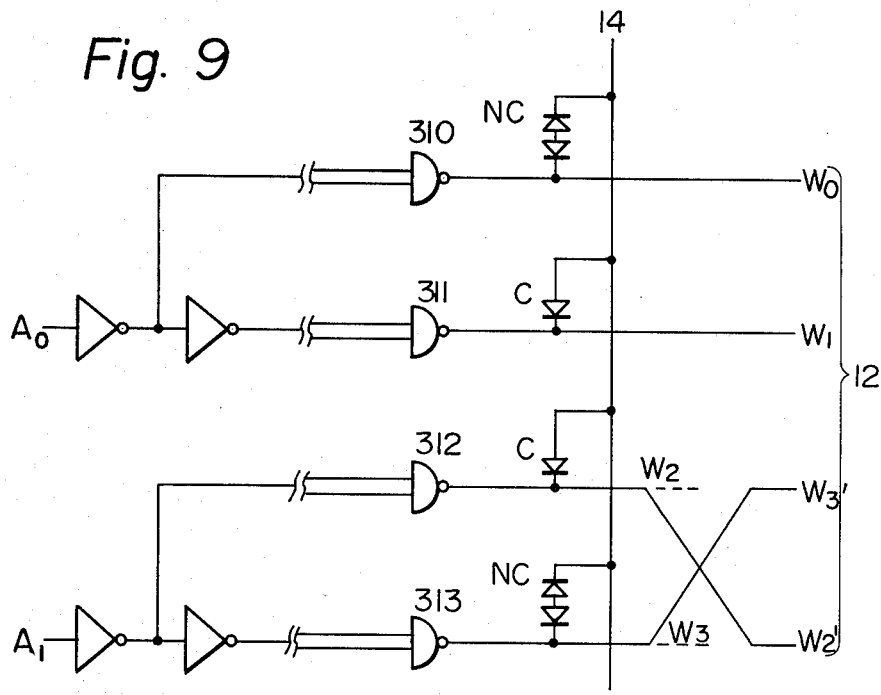
FIG. 9 is a circuit illustrating the arrangement of test memory cells to be connected to a test bit line for enabling the detection of a short-circuit between adjacent word line conductors of the device in accordance with a further embodiment of the present invention.

It is preferable to eliminate an incorrect test caused by a short circuit of two adjacent conductors, e.g., adjacent word lines 12, in a field programmable device under test. The circuit for eliminating such an incorrect test in accordance with an embodiment of the present invention is illustrated in FIG. 9. In the circuit of FIG. 9, one of the neighboring or adjacent word line 12, to both of which respective test memory cells 16 of the same conductivity type, (i.e., either both C or both NC) are connected is exchanged in its position with the next, i.e. the respectively adjacent, next successive word line. That is, in the case where the order of the test memory cells 16 is "NC, C, C, NC", corresponding to the successive word lines 12, for example, those designated $W_0$, $W_1$, $W_2$ and $W_3$ in FIG. 6, the order of the word lines 12 is caused to be "$W_0$, $W_1$, $W_3'$, $W_2'$" by exchanging or interchanging the positions of the word line $W_2$ and $W_3$ as shown in FIG. 9. In the circuit of FIG. 9, an incorrect test due to a short circuit between, for example, the interchanged, and now adjacent word lines $W_1$ and $W_3$ is eliminated, because a short circuit between the word lines $W_1$ and $W_2$ can be detected because of the opposite conductivity types C and NC of the respective test memory cells 16 connected to the word lines $W_1$ and $W_3$.

If the original order "$W_0$, $W_1$, $W_2$, $W_3$" of the word lines 16 as shown in FIG. 6 were maintained, an incorrect test result would be produced if short circuit between the wordlines $W_1$ and $W_2$ occurs, since the respective memory cells 16 connected to those word lines $W_1$ and $W_2$ are of the same ("C") conductivity type.

The above explanations of the embodiments of the present invention with reference to FIGS. 5, 6, 7, 8 and 9 are set forth mainly with respect to test bit lines. However, the present invention is also applicable to a field programmable device which provides having test word lines 12 and test memory cells 16 connected between the test word lines 16 and the bit lines 14.

Figure 10:
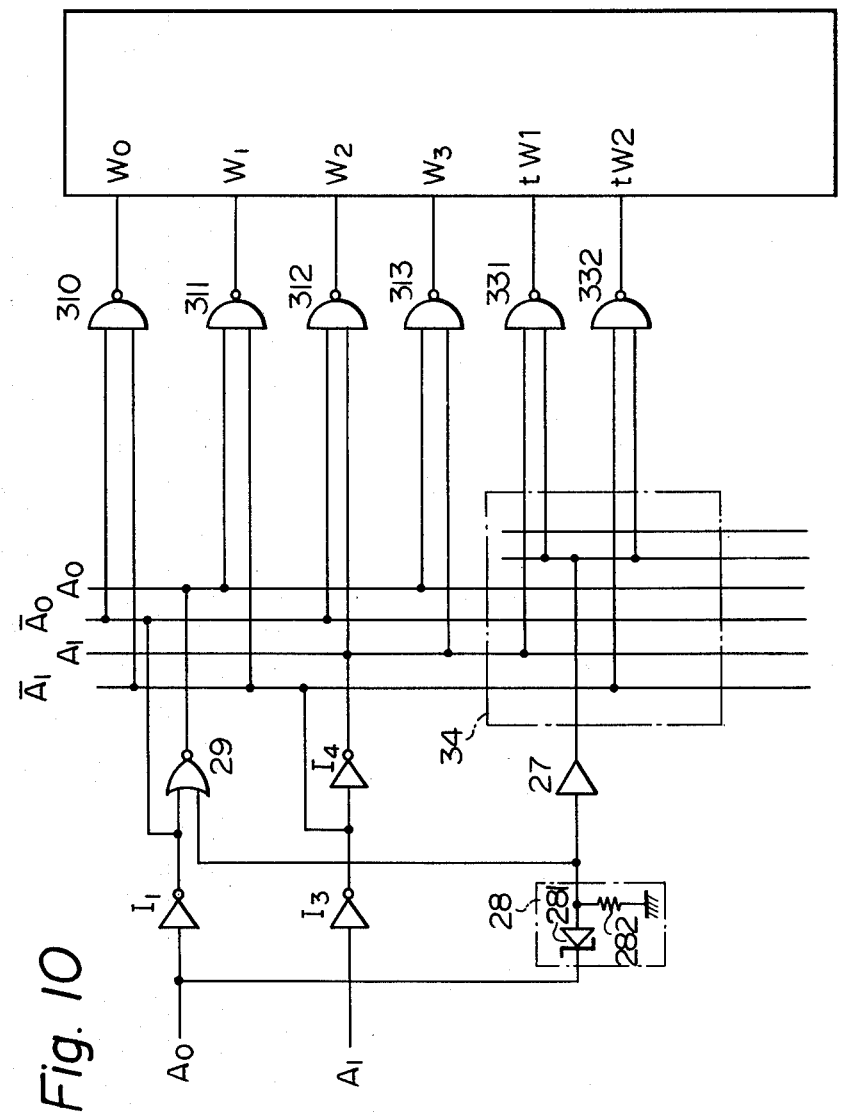
FIG. 10 is a circuit illustrating a logic circuit for selecting test word lines and or test bit lines, and which is particularly suitable for testing the field programmable device in accordance with the present invention.

A logic circuit for selecting a test word line 12 or a test bit line 14 which is particularly suitable for the above described embodiments of the present invention is illustrated in FIG. 10. In the circuit of FIG. 10, a level sensing circuit 28 comprising, for example, a Zener diode 281 and a resistor 282 is connected to the address signal input $A_0$; and a NOR gate 29 is connected to the output of the inverter $I_1$, in turn connected to the address signal input $A_0$. The output of the level sensing circuit 28 is supplied to a second input of the NOR gate 29. NAND gates 331, 332, forming part of the decoder drives 3 of FIG. 1, and which are selected by the output signal of the level sensing circuit 28 and the output signal of the address inverter, are connected to the test word lines tw1 and tw2. The address signal inputs $A_0$, $A_1$, in addition to the ordinary "0" signal and "1" signal, levels have a third signal level "1H" which is higher than "1" and makes the level sensing circuit 28 produce a signal as high as the normal "1" level, which is used for selecting the test word lines tw1 and tw2.

In the circuit of FIG. 10, the address signal input $A_0$ is raised to the "1H" level in order to select the test word lines tw1 and tw2. Then, the output of the level sensing circuit 28 becomes "1", after which the output of the NOR gate 29 becomes "0", and the output of the inverter $I_1$, is "0". Accordingly, at least one input of each of the NAND gates 310, 311, 312 and 313 is "0", and therefore, none of the word lines $W_0$, $W_1$, $W_2$ and $W_3$ is selected. The output signal "1" of the level sensing circuit 28 is supplied to the amplifier 27, and accordingly, an input of each of the NAND gates 331 and 332 becomes "1". In this case, if the address signal input $A_1$ is "0", the output of the NAND gate 332 is caused to be "0", and accordingly, the test word line tW2 is selected; conversely, if the address signal input $A_1$ is "1", the output of the NAND gate 331 is caused to be "0", and accordingly, the test word line tW1 is selected.

Figure 11:
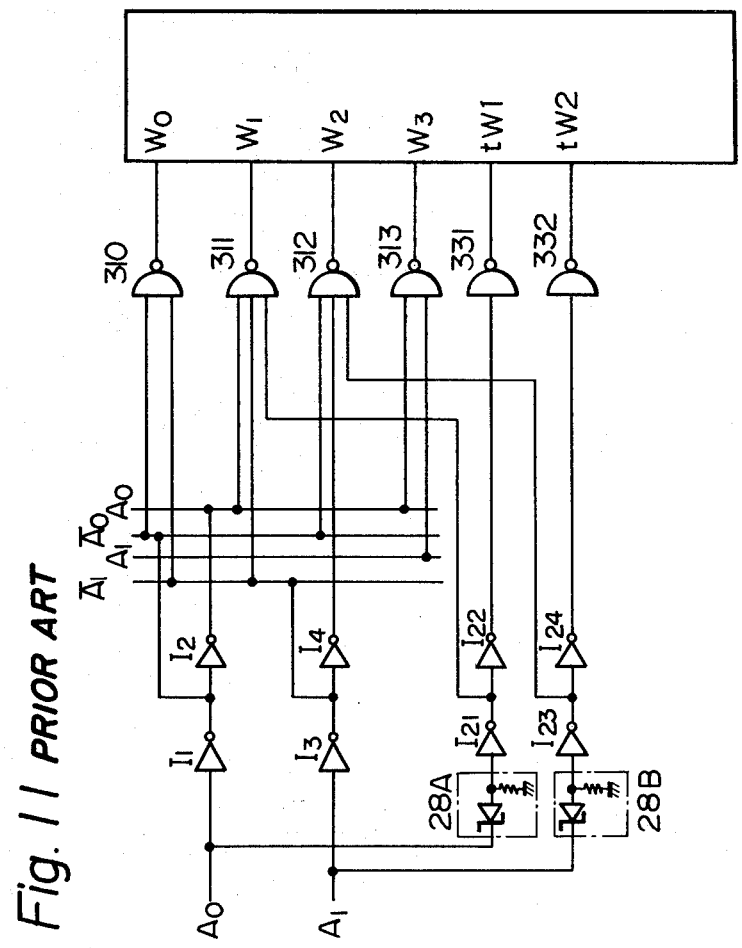
FIG. 11 is a circuit illustrating a prior art logic circuit related to the circuit of FIG. 10.

If this circuit of FIG. 10 is not used, disadvantages in the production of the field programmable device are unavoidable. These disadvantages are explained with reference to a prior art circuit illustrated in FIG. 11. In the circuits of FIG. 11, the level sensing circuit 28A and 28B are connected to the address signal inputs $A_0$ and $A_1$, respectively. When the address signal input $A_0$ is "1H", the output of the inverter $I_{21}$ is caused to be "0" and the output "0" of the inverter $I_{21}$ is supplied to the NAND gate 311, and accordingly, no selection of the word line $W_1$ is effected. Furthermore, when the address signal input $A_1$ is "1H", the output of the inverter $I_{23}$ is caused to be "0" and the output "0" of the inverter $I_{23}$ is supplied to the NAND gate 312, and accordingly, no selection of the word line $W_2$ is effected. The "0" outputs of inverters of $I_{21}$ and $I_{23}$, however, cause the outputs of inverters $I_{22}$ and $I_{24}$ to be "1", and thus provide enabling inputs to NAND gates 331 and 332 for respectively selecting the test word lines tW1 and tW2. In this way, in the circuit of FIG. 11, it is possible to perform the selection of the test word lines tW1 and tW2. However, in the circuit of FIG. 11, it is necessary to provide a level sensing circuit (e.g., 28A, 28B, ...) and inverters ($I_{21}$ and $I_{22}$, $I_{23}$ and $I_{24}$, ...) for each of the address signal inputs ($A_0$, $A_1$, ...), respectively, and connecting conductors between the outputs of level sensing circuits (28A, 28B, ...) and inputs of the NAND gates (311, 312, ...) of the decoder driver. This results in the disadvantages of a reduction of the degree of integration (i.e., parking density) of the integrated circuit of the field programmable device and an increase in the cost of production of the field programmable device, because the number of the circuit elements is increased and the circuit connections become for more complicated.

Although the circuit of Fig. 10, as shown, is used for the selection of the test word lines tW1 and tW2, it is readily adopted for use as a circuit for selecting the test lines $tb_1$ and $tb_2$ as shown at 14 in FIG. 2, as will be apparent to those of skill in the art. Also, although the circuit of FIG. 10 is applicable to the device having two test word lines, it is also possible to construct a circuit which is applicable to a device having three or more test word lines as will likewise be apparent.

Figure 12:
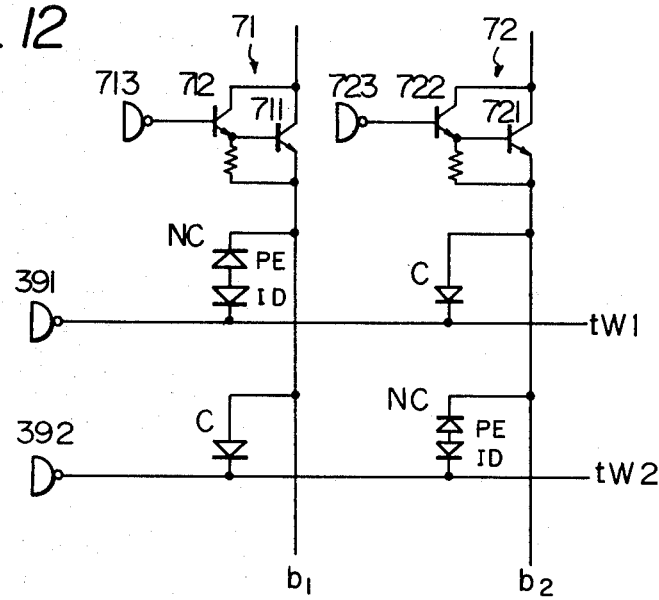
FIGS. 12 and 13 is a circuit illustrating the arrangement of test memory cells connected to test word lines for eliminating an incorrect test caused by a leakage of current in the device, in accordance with the present invention.
Figure 13:
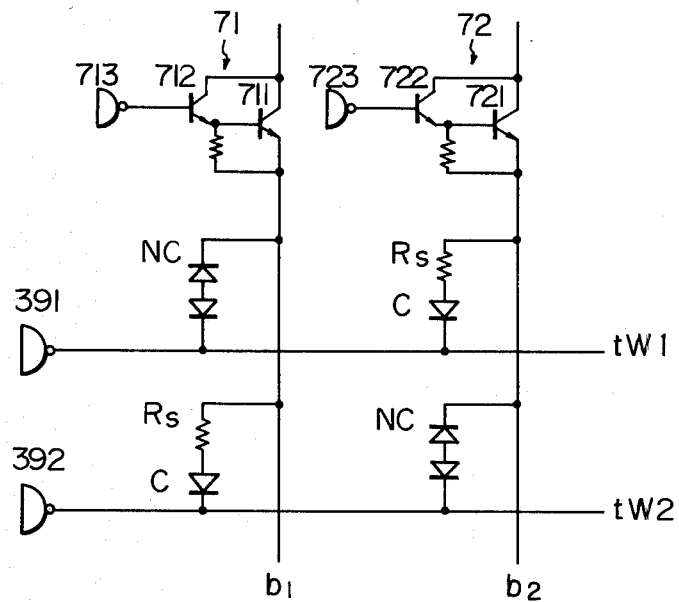

A modified structure for use in the above described embodiments of the present invention for eliminating an incorrect test due to current leakage in the device is illustrated in FIGS. 12 and 13. In the circuits of FIGS. 12 and 13, writing currents are supplied through programming circuits 71, 72 (corresponding to the circuit 7 of FIGS. 1) to test memory cells 16, having either a conductive (C) or non-conductive (NC) characteristic, which are connected at the cross points of the test word lines tW1, tW2 and the bit lines $b_1$, $b_2$. In the circuit of FIG. 12, the structure of the non-conductive (NC) test memory cells 16 is such that no writing-in is effected by the regular writing-in current for the regular memory cells 13 connected at the cross points of the bit lines 11 and the word lines 12 (as seen in FiG. 2). This modified structure is determined by, for example, the area of the emitter, the depth of the base, or the melting point of the electrode material of the programmable element (PE) of the non-conductive test memory cell (NC). When the structure is determined by the area of the emitter, the area of the emitter of the programmable element (PE) of the test memory cell is greater than that of the regular memory cell. In the circuit of FIG. 12, no writing-in of the non-conductive (NC) test memory cell 16 is effected by supplying a test writing-in current of, for example, 12 mA. Accordingly, it is possible to perform the test by using such a non-conductive NC test memory cell 16 in which no writing-in is effected.

In the circuit of FIG. 13, a resistor $R_s$ is connected in series with the conductive (C) test memory cell 16. It is possible to detect a leakage current in the programming circuits 71, 72, which occurs only when the applied voltage exceeds a predetermined value, by measuring the voltage drop across the resistor $R_S$ when the test current passes through the resistor $R_S$. Accordingly, it is possible to perform the test by using a resistor connected in series with the conductive test memory cell respectively associated with each bit line ($b1$, $b2$, ...).

If the circuits of FIGS. 12 and 13 are not used, an incorrect test due to current leakage in the device is unavoidable. The reason for the incorrect test can be explained by assuming that there is a defect causing current leakage only when the applied voltage exceeds a predetermined level in the programming circuits 71, 72. In such a case, when writing-in by the regular writing-in current to the test memory cell 16 is effected, it is possible to perform the test because the test is performed by passing the current through the conductive element (C) without causing current leakage in the programming circuits. However, it is impossible to effect the writing-in of the regular memory cells because of the interruption of the collector current of transistors 711, 721 of the programming circuits 71, 72 due to the shortage of the base current of said transistors 711, 712. Similarly, if no resistor is connected in series with the conductive test memory cell, it is impossible to perform the correct test.

Although the above explanation of the embodiments of the present invention is mainly directed to the operation of the X-direction address inverter and the X-direction decoder driver, it will be apparent to those skilled in the art that the present invention may similarly be applied to a field programmable device using a Y-direction address inverter, a Y-direction decoder driver and a multiplexer. Thus, it is intended by the appended claims to cover all such modifications and adaptations as fall within the true spirit and scope of the invention.

What is claimed is:

1. A field programmable device having a memory array member comprising:
    a plurality of regular bit lines,
    a plurality of regular word lines defining cross points with said plurality of regular bit lines,
    regular memory cells connected at respectively associated cross points between said plurality of regular bit lines and said plurality of regular word lines,
    at least one test line adjacent a corresponding one of said pluralities of said regular bit lines and said regular word lines and defining cross points with the lines of the other of said pluralities of regular bit lines and regular word lines,
    test memory cells respectively connected at the said cross points of said at least one test line and said lines of the said other of said pluralities of regular bit lines and regular word lines,
    means for selectively supplying address signals of "1" and "0" levels for selecting respectively corresponding ones of said lines of the said other of said pluralities of regular bit lines and regular word lines, and
    said test memory cells comprising non-conductive test memory cells connected at the said cross points with said corresponding lines of the said other of said pluralities of said regular bit and said regular word lines selected by a "0" level address signal, and conductive test memory cells connected at the cross points with said lines of the said other of said pluralities of said regular bit and said regular word lines selected by a "1" level address signal.

2. A field programmable device as recited in claim 1 wherein said other of said pluralities of regular bit lines and regular word lines includes additional said regular lines selected by an Nth address signal beyond said address signal having said "0" and "1" levels, and wherein:

said test memory cells are connected at the said cross points of said at least one test line and said additional said regular lines of said other of said pluralities and have an order of conductivity for the Nth address signal which is the reverse of the order of conductivity of the test memory cells connected to said regular lines of said other of said pluralities corresponding to the first through the (N−1)th address signals.

3. A field programmable device as defined in claim 1 comprising:

at least a second test line adjacent said corresponding one of said pluralities of said regular bit lines and said regular word lines and defining respective cross points with the lines of said other of said pluralities of regular bit lines and regular word lines, test memory cells respectively connected at the said cross points of said second test line and said lines of said other of said pluralities of regular bit lines and regular word lines, and wherein said test memory cells respectively connected at the said respective cross points of said second test line are of the opposite conductivity type to the test memory cells connected to the said at least one test line at its respective cross points with the same said lines of the other of said pluralities of regular bit lines and regular word lines.

4. A field programmable device as recited in claim 1 in which adjacent, successive ones of said additional lines of said other of said pluralities of regular bit lines and regular word lines are interchanged such that the successive, interchanged additional lines are connected to said at least one test line through test memory cells of successively opposite conductivity types.

5. A field programmable device as recited in claim 1 comprising:

at least a second test line adjacent said corresponding one of said pluralities of said regular bit lines and said regular word lines and defining respective cross points with the lines of said other of said pluralities of regular bit lines and regular word lines, test memory cells respectively connected at the said cross points of said second test line and said lines of said other of said pluralities of regular bit lines and regular word lines, and wherein said test memory cells respectively connected at the said respective cross points of said second test line are of the opposite conductivity type to the test memory cells connected to the said at least one test line at its respective cross points with the same said lines of the other of said pluralities of regular bit lines and regular word lines, and wherein adjacent, successive ones of said additional lines of said other of said pluralities of regular bit lines and regular word lines are interchanged such that the successive, interchanged additional lines are connected to said at least one test line through test memory cells of successively opposite conductivity types.

6. A field programmable device as recited in any of claims 1, 2, 3, 4, or 5 wherein each said test line is a bit test line, said corresponding one of said pluralities of regular lines is said plurality of regular bit lines, and said other of said pluralities is said plurality of regular word lines.

7. A field programmable device as recited in any of claims 1, 2, 3, 4 or 5 wherein each said test line is a word test line, said corresponding one of said pluralities of regular lines is said plurlaity of regular word lines, and said other of said pluralities is said plurality of regular bit lines.

* * * * *

UNITED STATES PATENT AND TRADEMARK OFFICE
CERTIFICATE OF CORRECTION

PATENT NO. : 4,320,507
DATED : March 16, 1982
INVENTOR(S) : Fukushima et al.

It is certified that error appears in the above-identified patent and that said Letters Patent are hereby corrected as shown below:

```
Front page, on next line after "Primary Examiner -- David H.
    Malzahn" insert --Attorney, Agent, or Firm -- Staas &
    Halsey--.
Column 1,  line 13, after "any" insert --of--;
           line 26, after "associated" insert --,--;
           line 36, after "memory" insert --cell--;
           line 38, after "14," insert --test--;
           line 39, "group" should be --groups--;
           line 56, "problem" should be --problems--;
           line 61, "calls" should be --cells--.
Column 2,  line 8, delete "a" (second occurrence);
           line 15, after "circuit" insert --schematic--;
           line 22, after "7" insert --illustrates--;
           line 37, "and or" should be --and/or--;
           line 42, "is" should be --are--.
Column 3,  line 29, "levels" should be --levels,--.
Column 4,  line 44, "Non conduction" should be
    --"Non-conduction"--.
Column 5,  line 13, after "which" insert --ninth to sixteenth
    memory cells--;
           line 27, delete "in the test bit line pair 14'
    comprises";
           line 28, after "8," insert --the test bit line pair
14' comprises--;
           line 32, after "line" (first occurrence) insert
--tbl--;
           line 35, "while" should be --and--;
           line 55, after "neighboring" insert --,--; after
"adjacent" insert --,--; "line" should be --lines--;
           line 58, after "connected" insert --,--;
           line 59, after "i.e." insert --,--;
           line 65, after "ing" insert --,--; after "interchang-
ing" insert --,--.
```

UNITED STATES PATENT AND TRADEMARK OFFICE
CERTIFICATE OF CORRECTION

PATENT NO. : 4,320,507
DATED : March 16, 1982
INVENTOR(S) : Fukushima et al.

It is certified that error appears in the above—identified patent and that said Letters Patent is hereby corrected as shown below:

Column 6, line 6, "$W_3'$" should be --$W_3$--;
line 8, after "if" insert --a--;
line 16, delete "which provides";
line 25, delete "and";
line 30, "drives" should be --driver--;
line 34, "signal," should be --signal--;
line 35, after "levels" insert --,--.
Column 7, line 17, "parking" should be --packing--;
line 21, "for" should be --far--;
line 25, after "test" insert --bit--;
line 59, "NC" should be --(NC)--.

Signed and Sealed this

Twenty-fourth Day of August 1982

[SEAL]

Attest:

GERALD J. MOSSINGHOFF

*Attesting Officer*  *Commissioner of Patents and Trademarks*